United States Patent [19]

Watanabe et al.

[11] Patent Number: 4,960,724

[45] Date of Patent: Oct. 2, 1990

[54] METHOD FOR DELETING UNUSED GATES AND METHOD FOR MANUFACTURING MASTER-SLICE SEMICONDUCTOR INTEGRATED CIRCUIT DEVICE USING THE DELETING METHOD

[75] Inventors: Shoichi Watanabe; Takayuki Takei, both of Takasaki; Terumine Hayashi, Hitachi; Takashi Natabe, Ibaragi, all of Japan

[73] Assignees: Hitachi, Ltd.; Hitachi Microcomputer Engineering Ltd., both of Tokyo, Japan

[21] Appl. No.: 378,143

[22] Filed: Jul. 11, 1989

[30] Foreign Application Priority Data

Jul. 21, 1988 [JP] Japan .................................. 63-182712

[51] Int. Cl.$^5$ .............................................. H01L 21/70
[52] U.S. Cl. .......................................... 437/51; 357/40; 364/490
[58] Field of Search ............................. 437/51, 56, 59; 364/490, 491; 357/40, 45

[56] References Cited

U.S. PATENT DOCUMENTS 4,602,339  7/1986  Aihara et al. ........................ 437/490

Primary Examiner—Brian F. Hearn
Assistant Examiner—T. Thomas
Attorney, Agent, or Firm—Fay, Sharpe, Beall, Fagan, Minnich & McKee

[57] ABSTRACT

A method is provided for manufacturing a master slice semiconductor integrated circuit device. Initially, a first total circuit diagram which is to be reformed into a master slice semiconductor integrated circuit device is defined. First and second circuit points on the first total circuit block which are to be used respectively as input and output terminals of the master slice semiconductor integrated circuit device are specified. Next, signal transmitting paths are successively traced from the output to the input of each logic gate located in the signal transmitting paths in actual use. In the course of the tracing, these traced gates are marked and the logic gates actually in use are identified. As a result, in addition to those logic gates having unused output terminals, the gates constituting a closed loop isolated from the signal transmitting paths for transmitting substantial output signals are identified as unnecessary gates and deleted. Further, gates outputting only a fixed value are determined and designated unnecessary gates which are also deleted.

5 Claims, 4 Drawing Sheets

| N1 | 0→1 |
|---|---|
| N2 | 0→1 |
| N3 | 0 |
| G1 | 0→1 |
| G2 | 0→1 |
| G3 | 0→1 |
| G4 | 0 |
| G100 | 0 |
| 201 | 0→1 |
| 202 | 0→1 |

| 203 | 0→1 |
|---|---|
| 204 | 0→1 |
| 205 | 0→1 |
| 206 | 0→1 |
| 207 | 0→1 |
| 208 | 0→1 |
| 210 | 0 |
| 211 | 0 |
| 212 | 0→1 |
| 213 | 0 |
| 214 | 0 |
| 215 | 0 |

| OUT1 | 0→1 |
|---|---|
| OUT2 | 0 |
| IN1 | 0→1 |
| IN2 | 0→1 |
| IN3 | 0→1 |
| IN4 | 0 |
| IN5 | 0 |

METHOD FOR DELETING UNUSED GATES AND METHOD FOR MANUFACTURING MASTER-SLICE SEMICONDUCTOR INTEGRATED CIRCUIT DEVICE USING THE DELETING METHOD

BACKGROUND OF THE INVENTION

The present invention relates to a method for deleting unused (unnecesssary) logic gates, and more particularly, relates to the technology effective for use in a method for deleting unused gates when converting, for example, total logic circuit diagrams in board image designed using a plurality of standard logic integrated circuits (ICs) into total logic circuit diagrams for a single-chip semiconductor integrated circuit device such as a gate array and a master-slice IC. Further, the present invention relates to a method for manufacturing a master-slice semiconductor circuit device using the aforesaid method for deleting unused gates.

Because of their improved versatility, standard logic ICs, such as standard TTL (transistor-transistor logic) ICs and standard CMOS (complementary metal-oxide-semiconductor) ICs are widely used for designing various logic boards. Meanwhile, semiconductor manufactures have numbers of hitherto designed logic circuit diagrams in board image on hand. With the advancement of the semiconductor manufacturing technology in recent years, it has become possible to form total logic circuits designed in board image on one chip.

On the other hand, since versatility of each standard logic IC has been enhanced as described above, there are a number of unused logic circuits included in a logic circuit actually designed in board image. For example, it is often the case that only 6-bit portions of an 8-bit register of a TTL IC are used. In such a case, logic circuits constituting 2-bit portions of the register become unused gates.

Therefore, when it is intended to reform existing or newly designed total logic circuits in a TTL board image into a single-chip semiconductor integrated circuit such as a gate array or a master-slice IC, it is desired to obtain total logic circuits for providing the semiconductor integrated circuit from which unused gates as described above are deleted. This is because enlargement of the chip area and increase in cost can be prevented by such arrangement.

A method for deleting unused basic cells is disclosed in U.S. Pat. No. 4,602,339 issued to Aihara, et al. The method for deleting unused basic cells is such that (1) determine the basic cells whose output terminals are not connected to any element to be unused basic cells and delete them and (2) also deletes basic cells whose output terminals have come out of connection with any element as a result of the process (1) described above.

Sugisaki et al. made a report on cell reduction function on Nov. 1, 1985, in "Electronic Technology", Vol 27, No. 12 (1985-11), pp. 45–49, published by the Nikkan Kogyo Shimbun, Ltd. The cell reduction function, here, includes backward reduction whereby such gates which are in the paths for functional blocks whose input/output terminals are open are automatically deleted and forward reduction whereby such gates which are in the paths for those whose input terminals are logically fixed are simplified.

Further, Toida et al. made a report on TTL-GA (Gate Array) automatic conversion program, entitled "CMOS 1.0 μm gate array 'HG62E Series'", in "Hitachi Review", Vol. 69, No. 7 (1987-07), pp. 79–82.

The present inventors found that the known method for deleting unused gates has the following problem.

The problem will be described taking as an example a synchronous divide-by-16 counter having 5-bit output and using standard TTL (Type LS161) as shown by broken line in FIG. 4. When this divide-by-16 counter is used as a divide-by-8 counter having 3-bit output, an output $Q_D$ and a ripple carrier output terminal CO come to be unused. Therefore, when using the known method for deleting unused gates, the AND gate G5 connected with ripple carrier output terminals CO can be deleted and the inverter N4 whose output terminal becomes unused as the result of the deletion of the AND gate circuit G5 can be deleted.

On the other hand, since the output signal of the flip-flop circuit FF1 coupled with the output terminal $Q_D$ is used as an input to the AND gate circuit G6, the flip-flop circuit which should be deleted is left undeleted. As the result, gate circuits G6, G7, G8, G9, and G10 and inverter N5 which should be deleted are also left undeleted. Therefore, there has been a problem with the known unused gate deleting method that, when there is an unused gate having such a feedback loop, the gate cannot be deleted.

In brief, the determination whether or not a gate is an unused gate is dependent on whether or not the output of the gate is unused. Therefore, even if a gate should be deleted, the gate is not deleted if its output is considered to be in use. As the result, a gate array comes to be formed based on logic circuits including unnecessary logic gates, which results in enlarged size and increased cost of the gate array.

SUMMARY OF THE INVENTION

An object of the present invention is to provide a method for deleting unnecessary gates wherein the rate of deletion of unnecessary gates is improved.

The above and other objects and novel features of the present invention will be more fully understood by the description given herein and the accompanying drawings.

Typical inventions disclosed herein will be described in brief as follows. When a single-chip semiconductor integrated circuit device is formed by means of first total logic circuit diagrams designed in board image using standard logic ICs, signals paths between first circuit points which will be used as external terminals for outputting signals from the single-chip semiconductor integrated circuit device and second circuit points which will be used as external terminals for inputting signals or external terminals for inputting control signals to the semiconductor integrated circuit device are traced in the direction from the circuit points to be used as the external terminals for outputting signals to the circuit points to be used as the external terminals for inputting signals. In the course of the tracing, a mark is put on each of the logic gates present in the signal transmitting paths. Further, logic gates to be supplied with the power supply voltage or ground potential of the circuit are detected and it is determined whether or not the output signal of such a logic gate varies.

According to the above described means, the signal transmitting paths are successively traced from the output to the input of each logic gate present in the signal transmitting paths in actual use, and in the course of the tracing, these traced gates are marked, and hence, the logic gates actually in use can be identified. As a result, in addition to those logic gates having unused output terminals, the gates constituting a closed loop isolated from the signal transmitting paths for transmitting substantial output signals, which have been unable to be deleted by known unused gate deleting methods, can now be identified as unnecessary gates. Further, gates outputting only a fixed value are determined to be unnnecessary gates. Thus, the rate of deletion of unnecessary gates can be improved according to the present invention.

Thus, by deletion of unnecessary gates from the above described first total logic circuit diagrams, second total logic circuit diagrams for an effective single-chip semiconductor integrated circuit device can be produced.

DESCRIPTION OF THE PREFERRED EMBODIMENTS

Before describing the present invention with reference to the accompanying drawings, the definition of unused gate and "unnecessary gate" will be given.

"Unused gate" means the logic gate which is out of a path for substantial signal transmission and is such that the logic function of the circuit can be achieved or the signal on the signal transmitting path is not affected even if the gate is deleted.

"Unnecessary gate" means a logic gate which is in the path for substantial signal transmission in a circuit formed for achieving a logic function but is such that the substantial logic function of the circuit cna be achieved even if the gate is deleted or is not required by the circuit for achieving its substantial logic function.

It should be noted here that the above defined unused gate and unnecessary gate are used herein without discrimination.

Now the present invention will be described with reference to the drawings.

Figures 6, 7:
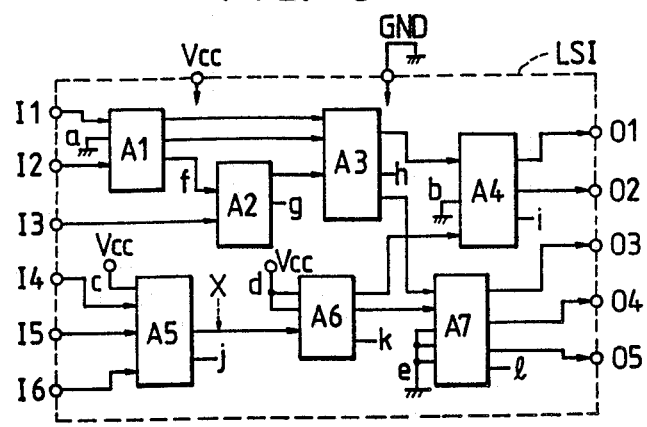
FIG. 6 is a conceptual drawing of conversion of total circuit diagrams designed in board image into a single-chip semiconductor integrated circuit LSI.
FIG. 7 is a drawing showing transition of stored information in a memory circuit used in the fan-in trace method according to the present invention.

FIG. 6 is a drawing showing the concept of conversion of first total circuit diagrams designed in board image using standard logic ICs A1, A2, A3, A4, A5, A6, and A7 into a single-chip semiconductor integrated circuit device LSI encircled by a broken line. Characters I1, I2, I3, I4, I5, and I6 denote second circuit points to be used as external terminals for inputting signals to the semiconductor integrated circuit device LSI to be designed and O1, O2, O3, O4, and O5 denote first circuit points to be used as signal outputting terminals of the semiconductor integrated circuit LSI to be designed. And, a, b, c, d, and e denote inputs to the standard logic ICs A1, A4, A5, A6, and A7 to be supplied with power supply voltage Vcc or ground potential GND, and f, g, h, i, j, k, and l denote unused outputs (unconnected outputs) of the above standard logic ICs A1, A2, A3, A4, A5, A6, and A7. The directions shown by arrows in the drawings are considered to be signal transmitting directions in the integrated circuit LSI to be designed.

According to the present invention, the signal transmitting paths between the external terminals O1-O5 for outputting signals and the external terminals I1-I6 for inputting signals are traced from the external terminals O1-O5 to the external terminals I1-I6 in the direction opposite to the signal transmitting direction. Further, such terminals as a-e for the logic gates supplied with the power supply voltage Vcc and ground potential GND are detected.

In FIG. 6, A1 to A7 are each shown as a TTL or CMOS standard logic IC on the market being arranged in a single package having a plurality of input and output terminals (pins), but they may be considered to be a logic function block (macrocell) having their functions. These logic functions can be expressed as an individual or a combination of basic logic gates such as inverter, NAND, NOR, OR and AND gates. Further, the logic function block (macrocell), when necessary, may be defined by the designer. The logic function block herein is understood to include both those defining functions of standard logic ICs on the market and those defined by the designer.

Since description of the actual unnecessary gate deleting method of the present invention becomes complex when it is made based on FIG. 6, detailed description of the same will be given using FIG. 1 to FIG. 3. Now, let it be assumed that the signal transmitting path from one of the external terminals O1-O5 has been traced back to the point marked by X in FIG. 6.

Figure 1:
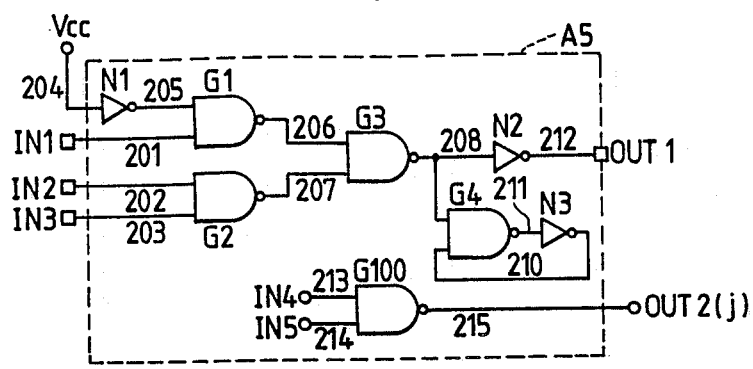
FIG. 1 is a circuit diagram showing an example of a logic circuit for explaining the present invention.

FIG. 1 is considered to be the logic function block A5 shown in FIG. 6 expressed with basic logic gates. To make understanding of the present invention easy, the block A5 is expressed in a simple circuit configuration.

The logic block A5 includes logic gates G1-G4 and G100, inverter circuits N1 and N2, input terminals IN1, IN2, and IN3, output terminals OUT1 and OUT2, wirings, given the symbols in predetermined formats as shown in FIG. 1. To facilitate understanding of the present invention, identification of the logic gates, inverter circuits, and terminals in the drawing are given by combinations of alphabets and numerals while the wiring are indicted by three-digit numerals. In reality, however, the logic gates, terminals, and wirings are classified by numeric values and the numeric values are assigned to addresses in a memory circuit within a large computer. In the storage area corresponding to the address in the memory circuit is stored a logical "0" as the initial value.

To detect unnecessary gates in the present embodiment, used gates are detected first, and then, unnecessary gates are detected based on the results of the detection. That is, the logic block A5 is traced from the signal outputting terminal OUT1 to be used by it in the direction opposite to the direction of the signal transmission. As the method for the tracing, a fan-in trace method, which is a method used for making a test pattern of a logic circuit, as utilized. The fan-in trace method will be explained in the following.

The tracing is conducted from the terminal OUT1 in use and reach the output of the inverter circuit N2 through the wiring 212. In the tracing, a that logical "1" is written in the storage area at the address of the memory circuit corresponding to the passed terminal OUT1 and wiring 212, storing the fact that the tracing has been made. Although it will not be stated each time in the following explanation, a logical "1" will similarly be written in the storage area at the address of the memory circuit corresponding to terminals, wirings, and logic gates similarly passed through in the tracing so that the fact that the tracing has been made is stored.

As to the inverter circuit N2, the tracing is carried out from its output toward its input opposite to the signal transmitting direction, and after the input has been reached, it is further conducted through the wiring 208 connected with the input until the output of the logic gate G3 is reached.

The above wiring 208 connected with the output of the logic gate G3 is also connected with the input of the logic gate G4, but the logic gate G4 is not traced because it is defined in the present invention that the tracing is always conducted opposite to the signal transmitting direction. Therefore, the storage area at the address of the memory circuit corresponding to the logic gate G4 is left at logical "0".

Since the logic gate G3 has two inputs, the tracing for the logic gate G3 is performed through two routes, one tracing route passing through the wiring 206 connected to one of its inputs and reaching the output of the logic gate G1 and the other tracing route passing through the other wiring 207 connected with its other input and reaching the output of the logic gate G2.

Since the logic gate G1 has two inputs, the tracing for the logic gate G1 is performed through two routes, one passing through the wiring 205 connected with one of its inputs and reaching the output of the inverter circuit N1 and the other passing through the wiring 201 connected with its other input and reaching the input terminal IN1. The tracing for the inverter circuit N1 is performed from its output to its input to reach the power supply voltage Vcc through the wiring 204.

Since the logic gate G2 has two inputs, the tracing for the logic gate G2 is performed through two routes, one passing through the wiring 202 connected with one of its inputs and reaching the input terminal IN2 and the other passing through the wiring 203 connected with its other input and reaching the input terminal IN3.

After all the above tracings have been finished, stored information is read out of the memory circuit. Untraced logic gate G4, logic gate G100, and inverter circuit N3 are determined to be unnecessary gates from the address information that is left as "0" for the same. In this case, as a matter of course, the wirings 215, 214, 213, 211, and 210, terminals IN4, IN5, and OUT2 are determined to be unnecessary. FIG. 7 shows the results of the above described tracing as types of stored information in the memory circuit, in which "0→1" indicates that the corresponding element has been traced and "0" indicates that the corresponding element has not been traced.

Figure 2:
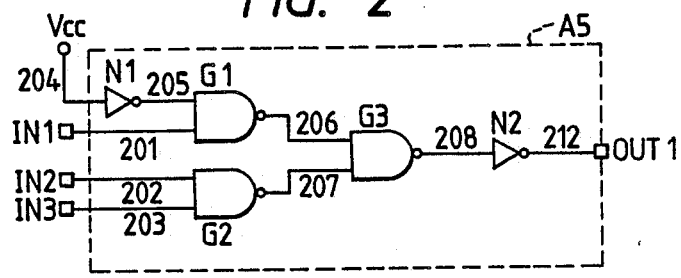
FIG. 2 is a logic circuit diagram obtained by deleting unnecessary gates from the logic circuit of FIG. 1 by means of fan-in trace according to the present invention.

By deleting some logic gates by the use of the fan-in tracing method as described above, the logic circuit shown in FIG. 1 is reduced to a simple logic circuit as shown in FIG. 2.

A simulation as described below is then applied to the logic circuit in FIG. 2 in the present embodiment, and thereby, detection to delete unnecessary gates existing in the logic circuit is performed.

Attention is paid to input terminals or inputs of the logic gates in the logic circuit shown in FIG. 2 to thereby detect logic gates having a fixed value of the power supply voltage (logical "1") or ground potential of the circuit (logical "0"). In the case of FIG. 2, the inverter circuit N1 is the one in that condition. Since it is known that the output of the inverter circuit N1 is fixed to a low level due to the fact input of the inverter circuit N1 is fixed at the power supply voltage Vcc, the inverter circuit N1 is determined to be an unnecessary gate. Then, with the deletion of the inverter circuit N1, the wiring 205 which has been in connection with its output terminal comes to be connected to ground potential GND.

In this condition, the output signal of the logic gate G1 is checked again by means of the above described simulation. Namely, it is checked whether or not the output signal of the logic gate G1 changes with a change between high level and low level of its input signal IN. Conversely, it is checked whether or not the output of the logic gates G1 becomes a fixed value by the above described high level to low level. Since the logic gate circuit G1 is a NAND gate circuit, either one of the input signals being at low level (logical "0") brings the output signal to a fixed high level (logical "1"). Hence, the logic gate circuit G1 is determined to be an unnecessary gate. Accordingly, the wiring 201 and the input terminal IN1 connected to the other input of the logic gate G1 are also determined to be unnecessary. With the deletion of the logic gate circuit G1 as described above, the wiring 206 connected with its output is changed to be connected with the power supply voltage Vcc.

In the desired state, the simulation is again applied to the logic gate G3 and the output signal of the logic gate G3 is checked. That is, similarly to the above, the logic gate G3 is checked whether or not its output signal becomes a fixed value with a high level supplied to its one input. Since the logic gate circuit G3 is a two-input NAND gate circuit, when one input signal is held at the high level, the output signal therefrom changes to high level or low level responding to the level of the other input signal. Hence, this logic gate circuit G3 is not determined to be an unnecessary gate.

Figure 3:
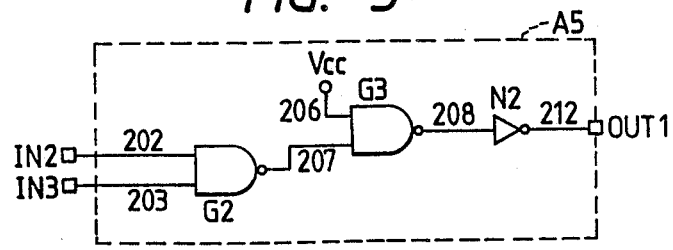
FIG. 3 is a logic circuit diagram obtained by deleting unnecessary gates from the logic circuit of FIG. 2 by means of a simulation method according to the present invention.

By the use of the above described simulation method to thereby delete unnecessary logic gates, the logic circuit as shown in FIG. 2 is further simplified and thereby a logic circuit as shown in FIG. 3 can be obtained.

Thus, the logic circuit shown in FIG. 1 including such logic gates that cannot be deleted by the method for removing logic gates on the ground that their output terminals are unused is subjected to a treatment to delete unnecessary logic gates by means of the above described fan-in tracing method and a treatment to delete unnecessary gates by means of the above described simulation method, and thereby, a greatly simplified logic circuit as shown in FIG. 3 for a single-chip semiconductor integrated circuit device can be obtained with the circuit function remaining substantially the same as that of the logic circuit in FIG. 1. In the described manner, simplification of the logic circuit in the blocks A1-A5 in FIG. 6 is carried out and second total circuit diagrams for a single-chip semiconductor integrated circuit device can be configured.

Figure 4:
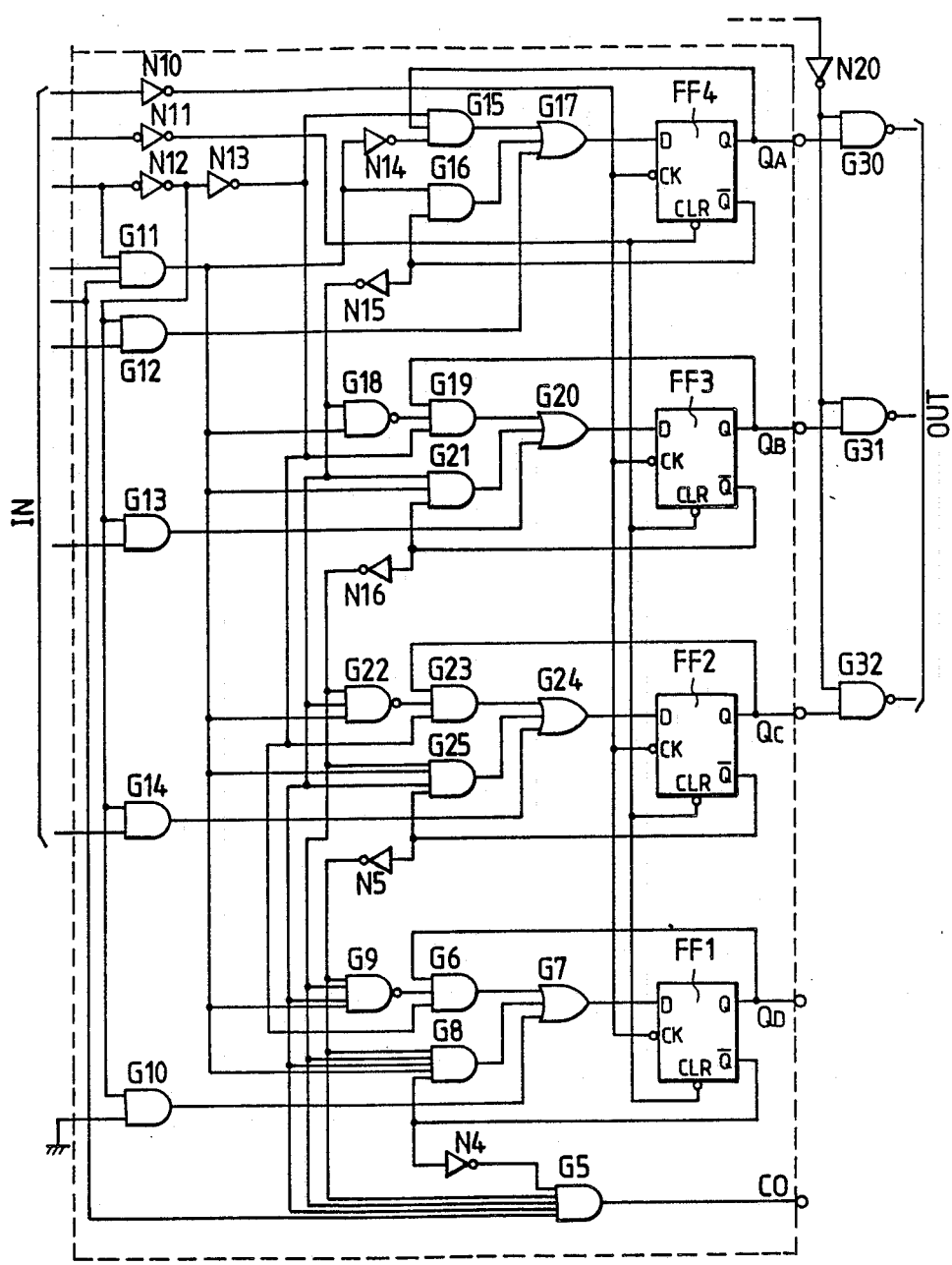
FIG. 4 is a circuit diagram showing an example of a counter circuit using a standard TTL circuit.

It is now considered to apply such simplification as described above to an actual standard TTL circuit shown in FIG. 4. Here, it is assumed that tracing has been finished up to output terminals $Q_A$, $Q_B$, and $Q_C$ of logic gates G30, G31, and G32 by means of the above described fan-in tracing method. When the tracing is performed from the terminals $Q_A$, $Q_B$, and $Q_C$ in use as the starting points, inverters N10, N11, N12, N13, N14, N15, and N16, logic gates G11, G12, G13, G14, G15, G16, G17, G18, G19, G20, G21, G22, G23, G24 and G25, flip-flops FF2, FF3, and FF4 in FIG. 4 are traced. An inverter N20 is traced at another tracing. It will be easily understood that flip-flop circuit FF1, logic gate circuits N4, G5, G6, G7, G8, G9, and G10, and wirings therebetween related with the unused output $Q_D$ and CO become untraced elements and all of these can be deleted. Thus, a circuit configuration including unnecessary gates and closed loops that have been unable to be deleted by known methods for deleting unnecessary gates can be treated to have these elements deleted from it by the method according to the present invention.

Therefore, by the use of the method for deleting unnecessary gates according to the present invention, a logic circuit designed using logic blocks such as standard TTL can be simplified when it is converted into a logic circuit adapted for forming a gate array, and thereby, reduction of the chip size can be achieved.

Figure 5:
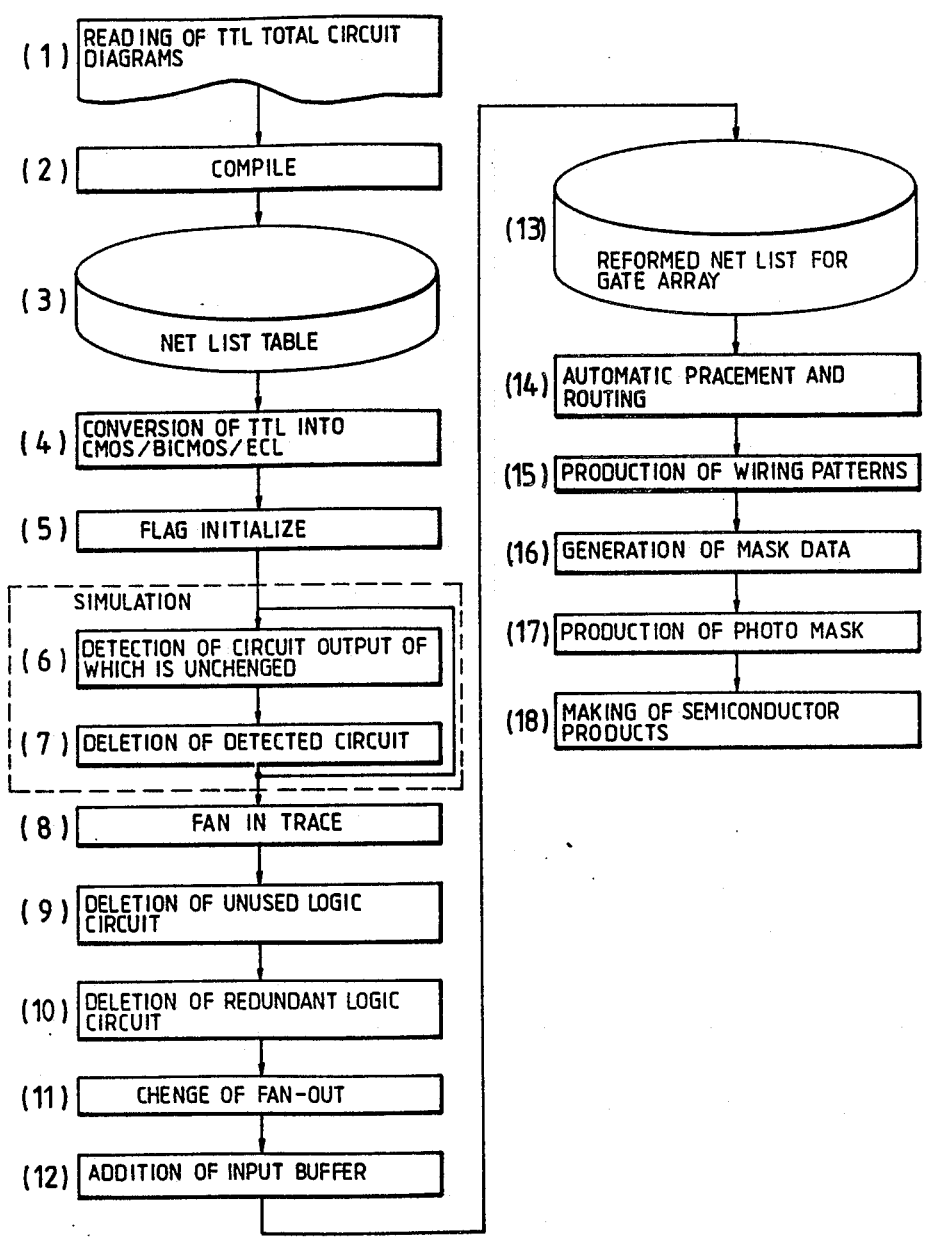
FIG. 5 shows a manufacturing flow of a single-chip semiconductor integrated circuit according to the present invention.

FIG. 5 shows a flow chart of an embodiment of an automatic designing system of a gate array including the method for deleting unnecessary gates according to the present invention.

In step (1), first total circuit diagrams designed by means of TTL are read by a large computer. The circuit diagrams may of course include newly designed logic circuits other than those already formed. This is because the designers are familiar with designing circuits using TTL. Prior to the step (1), a step (0) is of course performed for determining the range of the logic circuits to be incorporated into a gate array. In the step (0), circuit points which are to be used as input and output terminals of the gate array are specified.

In step (2), the logic circuits are compiled. More particularly, the above described circuit diagrams are each compiled into such data as are workable on the computer.

In step (3), above described circuits are each stored in a memory unit and thereby a net list table is created.

In step (4), the TTL circuits are each converted into a logic circuit corresponding to the kind of gate array to be used. For example, each TTL circuit is converted into a logic circuit intended for a CMOS gate array or BiCMOS gate array, e.g., into a CMOS circuit or a BiCMOS circuit. In TTL circuits, when explained with FIG. 4 taken as an example, the circuits encircled by the broken line in the figure are treated as a block box (macrocell). Therefore, in step (4), the macrocell is converted into the circuit representation formed of a plurality of logic gate circuits as shown in FIG. 4. The gate array may be an ECL circuit or it may be a TTL circuit itself, other than the above described CMOS or BiCMOS circuit.

In step (5), the memory circuit is initialized prior to the deletion of unnecessary gates as described above. Namely, each storage area in the memory circuit is brought to logical "0". This process is called "flag initialize".

In step (6), unnecessary gates are detected by means of the simulation method according to the present invention, or in other words, logic gate circuits whose output signal is unchanged (fixed) against change in the input signal thereto are detected.

In step (7), the unnecessary circuits detected in the above step (6) are deleted from the circuit diagram. The above steps (6) and (7) may be expressed as a single step.

In step (8), unused gates are detected by means of the fan-in trace method according to the present invention. More particularly, tracing is made from circuit points corresponding to signal outputting terminals of the gate array to be formed toward circuit points corresponding to signal inputting terminals thereof. Logic gates traced are marked and thereby unnecessary gates are detected.

In step (9), the unnecessary gates detected in the preceding step (8) are deleted from the circuit diagram. That is, those logic gates that are not marked in the step (8) are deleted from the circuit diagram.

In step (10), unused or unnecessary gates are deleted by a known method for deleting redundant logic. The method for deleting redundant logic is such that, when there is, for example, a logic circuit in which a NAND gate circuit receives N input signals through N inverter circuits and the output signal of the NAND gate circuit is output through an inverter circuit, such a circuit is converted into a single N-input NOR gate circuit so that (N+1) inverters comprised of the above inputs and output are deleted.

In step (11), a known fan-out conversion is performed. The fan-out conversion is such that, when there is, for example, an inverter circuit which outputs 2N outputs, another inverter circuit to receive the input in common with that inverter circuit is added to the same, in consideration of its driving capacity, so that the 2N outputs are shared by the two inverter circuits equally, N outputs each.

In step (12), a known process to add an input buffer is performed. More particularly, a logic gate receiving an input signal from an external terminal (pad) of the gate array is provided with an electrostatic breakdown preventing circuit or an input buffer changing the input level to the level suitable for the logic gate circuit.

In step (13), circuit data for logic circuits (second total circuit diagrams) intended for a reformed gate array are produced as the result of processes in the preceding steps (6), (7), (8), (9), (10), (11) and (12).

In step (14), gate allocation and wiring layout are performed from the above described logic circuit data by means of a DA (design automation) technique.

In step (15), the above described logic circuit data are converted into wiring pattern information whereby a wiring pattern is produced.

In step (16), mask data for a plurality of photomasks for actually forming circuits on a semiconductor substrate are generated. The photomasks, in the case of a gate array having two-layer wirings, include a contact hole forming mask, an aluminum wiring mask for the first layer, a through hole forming mask, an aluminum wiring mask for the second layer, and a mask for bonding pad holes. The bonding pad here means one that is used as a signal input/outputting terminal on the chip by being electrically connected with a pin provided on the package of the gate array through a bonding wire.

In step (17), photomasks are produced based on the above mask data.

In step (18), wirings with the use of the photomasks, an interlayer insulating film, a final protecting film, etc.

are applied to the semiconductor wafer for the master slice (gate array) with unwired transistors and MOSFETs disposed thereon and thereby products are obtained.

Through these steps of standard TTL circuits and having a specific function are reformed into a gate array.

In the above described embodiment, the order of steps from the step (6) to the step (11) may be changed as required or steps for adding an output buffer or the like may be added. However, the flow having the steps (6) and (7) performed before the steps (8) and (9) is the most effective flow. This is because closed loops that might be formed in the circuit as the result of the steps (6) and (7) could be deleted in the steps (8) and (9). In the case where the steps (8) and (9) are performed before the steps (6) and (7), it is preferred, for improving the unnecessary gate deleting efficiency, to perform the steps (8) and (9) again after the step (6) and (7) have been finished.

Operational effects obtained from the above described embodiment are as follows:

(1) Logic circuits designed with existing logic blocks such as standard TTL ICs are subjected to tracing of wiring paths from the output terminal side of the logic circuits to the input terminal side, whereby those having untraced wiring routes are determined to be unnecessary gates, and/or those logic gates receiving the power supply voltage or ground potential of the circuit are detected and the logic gates receiving those inputs having unchanged output signals are determined to be unnecessary gates, and further those logic gates constituting closed loops out of signal transmitting paths forming substantial output signals and logic gates outputting only a fixed value in addition to those having unused output terminals are also determined to be unnecessary gates. Thus, an effect is obtained that the rate of deletion of unnecessary gates can be improved.

(2) When logic circuits designed by the use of logic blocks such as standard TTLs are reformed into a gate array, the logic circuits to be formed into the gate array can be simplified as described in (1) above. Accordingly, an effect is obtained that the chip size of the gate array can be reduced.

(3) From the substantial deletion of unnecessary gates achieved as described in (2) above, an effect is obtained that power consumption can be reduced.

(4) Since the deletion of unnecessary gates as described above can be executed by software using a computer, an effect is obtained that a great deal of reduction of man hours and prevention of errors, as compared with the case where the unnecessary gates are manually deleted, can be achieved.

While the invention made by the present inventors has been described based on a specific embodiment, it is apparent that the present invention is not limited to the above described embodiment but various changes can be made without departing from the spirit of the invention. For example, it may be possible to delete unnecessary gates only by the fan-in tracing method or by the simulation method. Further, as to the software for the computer achieving the unnecessary gate deleting system according to the present invention, while a type has been described above which gives numbers to the circuit elements such as gates, terminals, and wirings, and connects the numbers with addresses in the memory circuit so that traced/untraced elements are stored therein, it can be of any other type if it is such that the tracing is performed with flags set in the traced logic gates.

The logic blocks can also be of other types than those of standard TTL as described above, if they are logic blocks which can be treated as black box such as general purpose macrocells used for designing standard ECL or LSI circuits.

The present invention can be widely used for systems for deleting unnecessary gates other than that for reforming logic circuits into a gate array as described above.

What is claimed is:

1. A method for deleting unused gates for use in converting first total circuit diagrams formed of a plurality of integrated circuit devices into second total circuit diagrams adapted for forming a single-chip semiconductor integrated circuit device, the method comprising the steps of:
   (1) specifying first circuit points to be used as external terminals for outputting signals and second circuit points to be used as external terminals for inputting signals of said semiconductor integrated circuit device on said first total circuit diagrams;
   (2) tracing signal transmitting paths between said first circuit points and said second circuit points starting from said first circuit points and advancing toward said second circuit points to thereby detect logic gates included in said signal transmitting paths; and
   (3) forming said second total circuit diagrams by deleting logic gates other than those detected in said step (2) from said first total circuit diagrams.

2. The method for deleting unused gates according to claim 1, wherein said step (2) includes the steps of:
   (i) tracing each logic gate existing in said signal transmitting paths only in an opposite direction from its output to its input, and
   (ii) identifying logic gates which are traced in said step (i), and wherein
   said steps (i) and (ii) are repeated until said signal transmitting paths are traced from said first circuit points to said second circuits points.

3. The method for deleting unused gates according to claim 1, wherein
   each of said plurality of integrated circuit devices constituting said first total circuit diagrams is contained in a single package and has a plurality of external terminals for inputting and outputting signals.

4. A method for converting first total circuit diagrams formed of a plurality of functional blocks into second total circuit diagrams adapted for forming a single-chip semiconductor integrated circuit device comprising the steps of:
   (1) detecting first circuit points and second circuit points on said first total circuit diagrams, which respectively correspond to output terminals and input terminals of said semiconductor integrated circuit device;
   (2) tracing signal transmitting paths between said first circuit points and said second circuit points starting from said first circuit points thereby detecting logic gates included in said signal transmitting paths, wherein said tracing proceeds in a direction opposite to a signal transmitting direction; and
   (3) causing said first total circuit diagrams to be reformed into said second total circuit diagrams responding to information detected in said step (2).

5. A method for manufacturing a master slice semiconductor integrated circuit device comprising the steps of:
- (a) defining first total circuit block diagrams to be reformed into said master slice semiconductor integrated circuit device;
- (b) specifying first circuit points to be used as output terminals and second circuit points to be used as input terminals of said master slice semiconductor integrated circuit device on said first total circuit block diagrams determined in said step (a);
- (c) representing said first total circuit block diagrams by a plurality of basic logic gates;
- (d) detecting basic logic gates included in signal transmitting paths between said first circuit points and said second circuit points;
- (e) reforming said first total circuit block diagrams into second total circuit diagrams for said master slice semiconductor integrated circuit device by deleting basic logic gates other than the basic logic gates detected in said step (d) from the basic logic gates constituting said first total circuit block diagrams; and,
- (f) producing a plurality of photomasks for forming said master slice semiconductor integrated circuit device based on the second total circuit diagrams formed in said step (e).

* * * * *